(12) United States Patent
Stengel et al.

(10) Patent No.: US 6,222,405 B1
(45) Date of Patent: Apr. 24, 2001

(54) APPARATUS AND METHOD FOR GENERATING ACCURATE QUADRATURE OVER A FREQUENCY RANGE

(75) Inventors: Robert E. Stengel, Pompano Beach; David E. Bockelman, Weston; Daniel E. Brueske, Plantation, all of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/507,722

(22) Filed: Feb. 22, 2000

(51) Int. Cl.[7] .................................................... H03H 11/16
(52) U.S. Cl. ........................... 327/254; 327/231; 327/100
(58) Field of Search ................................. 327/100, 113, 327/254, 255, 257, 258, 231, 238

(56) References Cited

U.S. PATENT DOCUMENTS 3,109,939 * 11/1963 Chin et al. ............................. 327/254
5,282,072 * 1/1994 Nazarathy et al. ................... 327/100

* cited by examiner

Primary Examiner—Dinh T. Le
(74) Attorney, Agent, or Firm—Scott M. Garrett

(57) ABSTRACT

The invention produces an accurate quadrature relationship for a range of frequencies using passive components in the primary quadrature splitting circuits. A reference oscillator (202) generates a reference signal which is fed to a conventional passive quadrature splitter circuit (204). However, since the reference circuit provides signals over a range of frequencies, the output signals of the passive quadrature splitter may not have an accurate quadrature relationship. The output signals of the passive quadrature splitter are then equalized in magnitude, and the sum and difference of the signals are produced, which will be in an accurate quadrature relationship.

14 Claims, 3 Drawing Sheets

APPARATUS AND METHOD FOR GENERATING ACCURATE QUADRATURE OVER A FREQUENCY RANGE

TECHNICAL FIELD

This invention relates in general to quadrature generation in communications equipment, and more particularly to accurate quadrature generation over a frequency range using a passive splitter.

BACKGROUND OF THE INVENTION

Many digital communication systems use quadrature techniques, such as quadrature amplitude modulation, because of advantages over other digital modulation techniques. Since most communication systems operate over a range of frequencies, it is necessary to generate quadrature at any frequency in the desired range. Quadrature generation techniques can be classified into either active or passive techniques. Active quadrature splitters, such as digital dividers, are more popular because passive splitters are only truly accurate at one frequency. Deviation from that frequency results in signals that are not 90 degrees apart, which can degrade system performance to the extent that it is unusable.

However, active quadrature generation circuits, although capable of generating quadrature over a range of frequencies, are much more complex than passive quadrature generation circuits. In the personal communications market, low cost is a driving market force, so it is preferable to avoid using complex circuitry when possible. A passive quadrature generation circuit that is operable over a frequency range would be ideal. Therefore there is a need for a means of generating accurate quadrature using passive components that is operable over a range of frequencies.

DETAILED DESCRIPTION OF A PREFERRED EMBODIMENT

Figure 1:
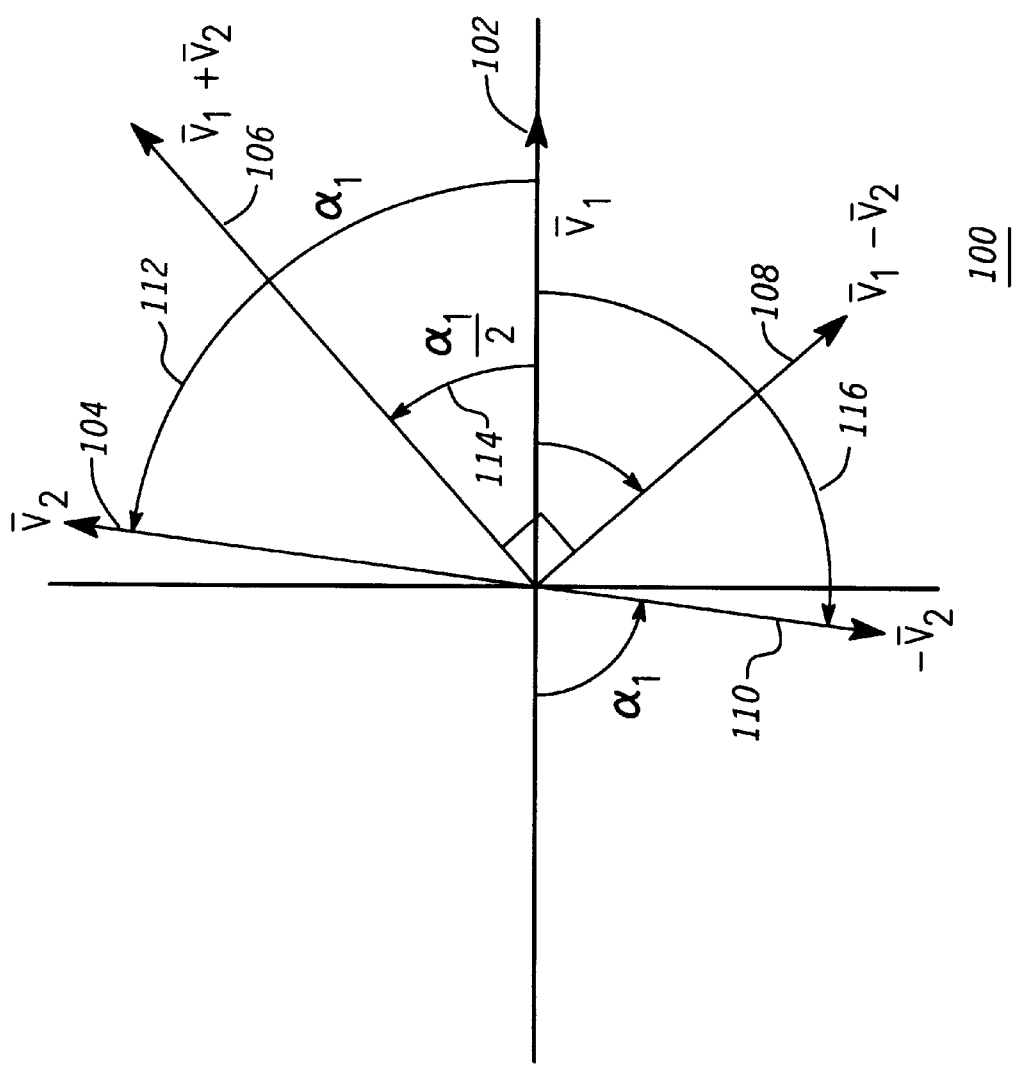
FIG. 1 shows a vector diagram of two signals generated with a passive quadrature splitter, and the sum and difference vectors of those signal.

While the specification concludes with claims defining the features of the invention that are regarded as novel, it is believed that the invention will be better understood from a consideration of the following description in conjunction with the drawing figures, in which like reference numerals are carried forward.

The invention takes advantage of the fact that the sum vector and difference vector of two signals having equal magnitudes will always be 90 degrees apart, provided the angle between the signals is not 0 or 180 degrees. Referring to FIG. 1, there is shown a vector diagram 100 of two signals generated with a passive quadrature splitter, and the sum and difference vectors of those signals. A first signal is represented by vector $V_1$ 102, which lies along the horizontal axis, and a second signal is represented by a second vector $V_2$ 104 which is offset in phase from the first signal by less than 90 degrees of phase angle. These two vectors represent a situation in which a passive quadrature splitter is used, but the frequency of the input signal is different than the optimum frequency for the splitter, and a phase error results from ideal quadrature phase difference of 90 degrees between the two output signals. Further shown is the sum of the two vectors, $V_1+V_2$ 106, and the difference of the two vectors, $V_1-V_2$ 108. The difference is found by summing the first vector with a vector that is the opposite of the second vector, $-V_2$ 110. The first and second vectors are equivalent in magnitude. It is a well known principle of vector mathematics that the sum of two vectors having equal magnitudes results in a vector having an angle exactly midway between the two. Here, the second vector has an angle $\alpha_1$ 112 with respect to the first vector, thus the sum of the two vectors has an angle of $\alpha_1/2$ 114. The angle between the first vector and the negative of the second vector is then $-180+\alpha_1$ 116, and thus the angle between the first vector and the difference of the two vectors is then $(-180+\alpha_1)/2$. Therefore, the angle between the sum and difference vectors is the difference between the two angles, $\alpha_1/2-(-80+\alpha_1)/2$, which reduces to 90 degrees. This always hold so long as the vectors are equal in magnitude, and not 0 or 180 degrees apart. However, unlike the first and second vectors, the sum and difference vectors are not equal in magnitude.

Figure 2:
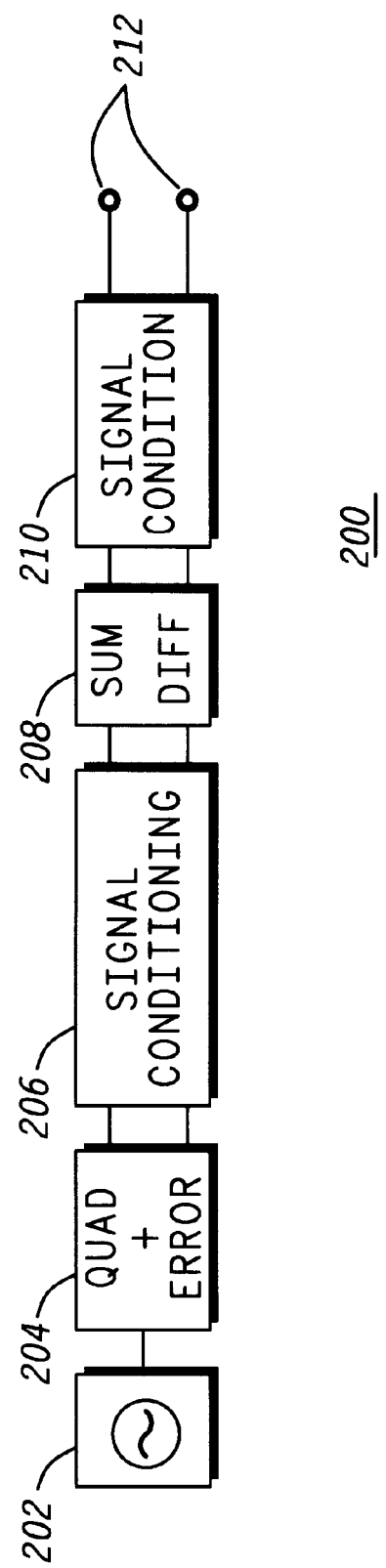
FIG. 2 shows a block diagram of a quadrature generation line-up in accordance with the invention.

Referring now to FIG. 2, there is shown a block diagram of a quadrature generation line-up 200 in accordance with the invention. The line up starts with a reference oscillator 202, which provides a reference signal to a passive quadrature generation circuit 204. The signal is a periodic signal that is electrical, such as a sinusoidal voltage signal. The reference oscillator is capable of providing the reference signal at different frequencies within an operating frequency range. The range would typically be, for example, the range of frequencies over which a mobile communication device would operate. The passive quadrature generation, which in practice only produces accurate quadrature at one frequency, generates two signals, which will likely not be precisely 90 degrees apart in phase. The two signals may be fed to a first signal conditioning block 206 to equalize the magnitude of the two signals, which are then fed to a sum and difference block 208, which produces the sum and difference signals 212, which will be in real quadrature with each other. In an alternative embodiment, the sum and difference signals may be fed to a second signal conditioning block 210 to equalize their magnitudes for use by, for example, a digital modulator. However, it is contemplated that in many instances the magnitudes of the sum and difference signals will be usable directly after the sum and difference block.

Figure 3:
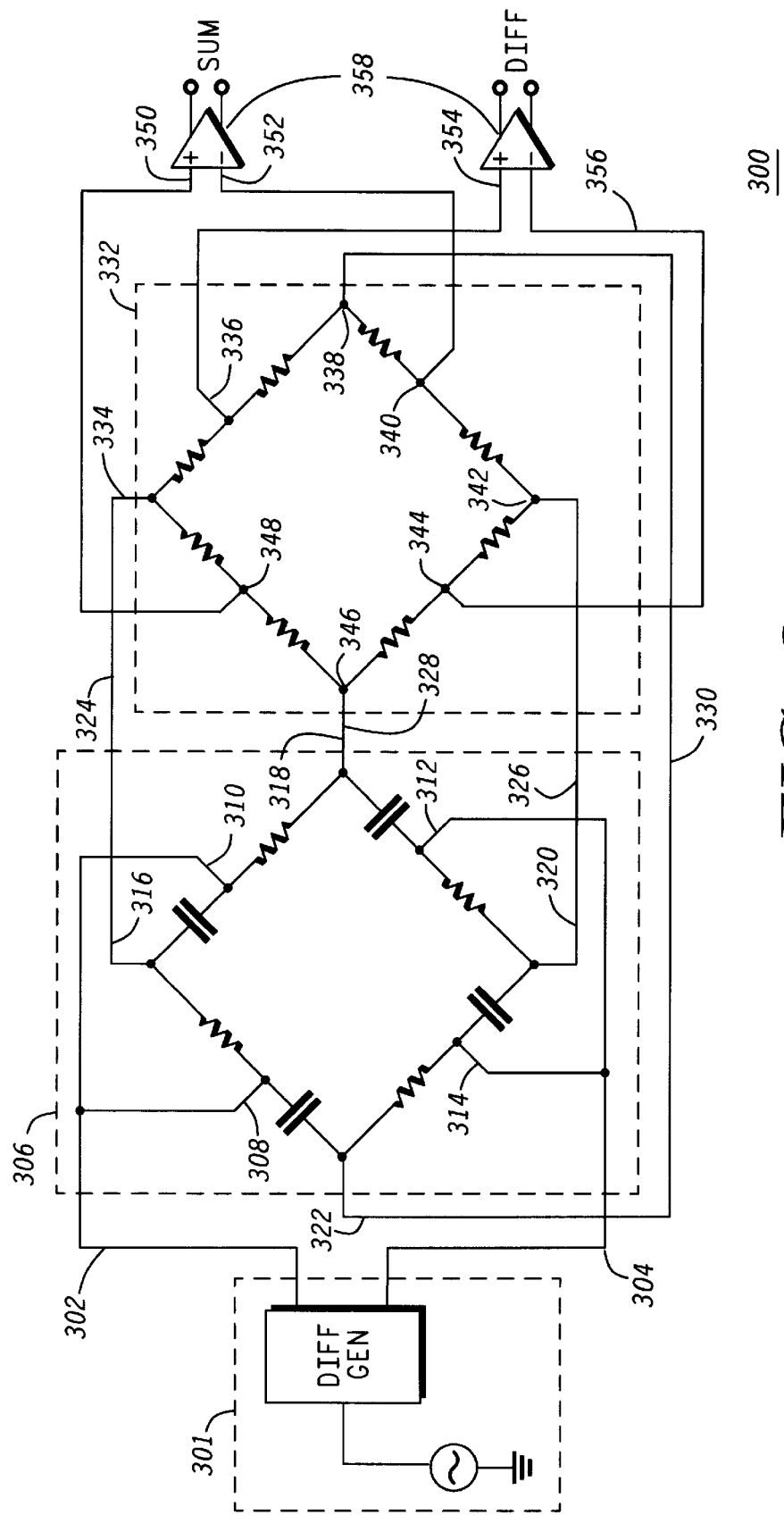
FIG. 3 shows a schematic diagram of a quadrature generation circuit in accordance with the invention.

The circuit for realizing the line up of FIG. 2 is shown in FIG. 3. Referring now to FIG. 3, there is shown a schematic diagram of a quadrature generation circuit 300 in accordance with the invention. In practice, a reference oscillator means 301 provides a reference pair of signals with a first signal on line 302 and a second signal on line 304. These reference signals are identical in frequency but offset 180 degree from one another. The reference pair is provided to a means for generating, 306, a first differential pair and a second differential pair of signal, which is the equivalent of block 204 of FIG. 2. In the preferred embodiment, the means for generating the first and second differential pair is a polyphase bridge circuit including 0, 90, 180, and 270 degree input terminals 308, 310, 312, and 314, respectively, and likewise 0, 90, 180, and 270 degree output terminals 316, 318, 320, and 322 respectively. Resistive components are electrically coupled between the 0 degree input and output terminals 308 and 316, between the 90 degree input and output terminals 310 and 318, between the 180 degree input and output terminals 312 and 320, and between the 270 degree input and output terminals 314 and 322. Capacitive components provide the necessary phase shift, and are coupled between the 0 degree input and 270 degree output terminal 308 and 322, between the 90 degree input and 0 degree output terminals 310 and 316, between the 180 degree input and 90 degree output terminals 312 and 318, and between the 270 degree input and 180 degree output terminals 314 and 320. The first differential pair of signals is provided on lines 324 and 326 and the second differential pair of signals is provided on lines 328 and 330. The signals on lines 324 and 326 will be 180 degrees offset, and likewise so will the signals on lines 328 and 330. In practice it is preferable to use differential signals, where the difference between, for example, the signals on lines 324 and 326 is used rather than either one of the signal individually. However, one skilled in the art will recognize that a single signal may be used instead of the difference of a pair. The phase difference between the first and second differential pairs will only be 90 degrees at one frequency, determined by the values of the resistive and capacitive components, which, in the preferred embodiment, are matched in resistance and reactance values, respectively. However, since it is the purpose of the invention to provide quadrature over a frequency range, the phase difference between the two differential pairs will not be 90 degrees except at one frequency. As the frequency is shifted from that one particular frequency, the phase difference will change as well.

In the preferred embodiment, the reference pair of signals provided on lines 302 and 304 are equal in magnitude, and since the passive components of the polyphase bridge are matched, the signals on lines 324, 326, 328, and 330 will also have the same magnitude. However, if unmatched passive components are used, then a signal conditioning circuit, such as that represented by block 206 of FIG. 2 would be required to equalize the magnitudes. It is also contemplated that adjustable components may be used in the polyphase splitter circuit to control the output magnitude of the signals on lines 324, 326, 328, and 330, in cases where the phase differential between the first and second differential pairs of signals is closer to 180 degrees, and the sum or difference signal magnitude would be very small. This would provide a sort of signal boost before applying the signal to an equalizer means.

The first and second differential signals are provided to a means for producing the sum and difference, 332, of the first and second differential pairs. In the preferred embodiment, the means for generating the sum and difference includes a sum/difference bridge circuit formed of eight resistive components coupled in series in a loop, and thereby providing eight terminal points. Preferably the eight resistive components are matched in resistance value. The first differential pair of signals is applied between a first terminal 334 and a fifth terminal 342, and the second differential pair of signals is applied between the third terminal 338 and the seventh terminal 346. If one views the signals on lines 324 and 328 as the positive signals, since the signals on lines 326 and 330 are 180 degrees offset from their respective positive signal, they may be considered the negative of those signals. Thus, the resulting signal at the eighth terminal 348 is the sum of the signals on lines 324 and 328. Likewise the resulting signal at the fourth terminal 340 is the sum of the signals on lines 326 and 330, which is the sum of the negatives of the signals on lines 324 and 328. Thus, a third differential pair of signals is produced between the eighth and fourth terminals which is the sum of the first and second differential pairs of signals. Since the signal on line 326 is the negative of the signal on line 324, the resulting signal at the sixth terminal 344 is the difference between the signals on lines 324 and 328, and likewise the result at the second terminal is also difference between the signals on line 324 and 328, but offset 180 degree from the signal at the sixth terminal. Thus a fourth differential pair of signals is provided between the sixth and second terminals of the sum/difference bridge circuit. The third and fourth differential signals will be apparent on line 350, 352, and 354, 356 respectively, and will be 90 degrees out of phase with respect to each other. Since the third and fourth differential signals may have different magnitudes, as shown in reference to FIG. 1, it may be preferable to equalize the two pairs with, for example, amplifiers 358 having an automatic gain control to provide the sum and difference signals suitable for use in a digital quadrature modulator. If differential signals are not needed, than it would be apparent to one skilled in the art that either signal from the third pair of signals and either signal from the fourth pair of signals will also be 90 degrees offset from each other.

Thus, the invention provides a means for generating accurate quadrature using only passive components in the splitter circuitry by taking advantage of the fact that the sum and difference of two signals of equal magnitude and frequency will be 90 degrees offset with respect to each other, subject to the two signals being offset by some angle that is not 180 degrees. In the preferred embodiment a polyphase splitter is used to generate a pseudo-quadrature relationship, and a sum/difference bridge is used to produce an accurate quadrature relationship.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An apparatus for generating an accurate quadrature signal pair over a frequency range, comprising:

means for generating a first differential pair and a second differential pair of signals, the first and second differential pair of signals having substantially equal magnitudes; and means for producing the sum and difference of the first and second differential pairs of signals to provide a third pair of differential signals and a fourth pair of differential signals, and wherein the third and fourth pair of differential signals have a phase offset of substantially 90 degrees.

2. An apparatus for generating an accurate quadrature signal pair as defined in claim 1, wherein the third and fourth differential pair of signals have a third and fourth magnitude, respectively, the apparatus further comprising a means for equalizing the third and fourth magnitudes.

3. An apparatus for generating an accurate quadrature signal pair as defined in claim 1, wherein the means for generating the first and second pair of differential signals includes a polyphase bridge circuit comprising:

- 0, 90, 180, and 270 degree input terminals;
- 0, 90, 180, and 270 degree output terminals;
- resistive components coupled between the 0 degree input and output terminals, 90 degree input and output terminals, 180 degree input and 180 degree output terminals, and 270 degree input and 270 degree output terminals; and
- capacitive components coupled between the 0 degree input and 270 degree output terminals, 90 degree input and 0 degree output terminals, 180 degree input and 90 degree output terminals, and 270 degree input and 180 degree output terminals;
- wherein the first differential pair of signals is produced between the 0 degree and 180 degree output terminals, and the second differential pair of signals is produced between the 90 degree output and 270 degree output terminals.

4. An apparatus for generating an accurate quadrature signal pair as defined in claim 1, wherein the means for producing the sum and difference of the first and second differential pairs of signals comprises:

- a sum/difference bridge circuit formed of eight resistive components coupled in series in a loop thereby producing eight terminal points;
- the first differential pair of signals is applied between a first terminal and a fifth terminal of the sun/difference bridge, the second differential pair of signals is applied between a third terminal and a seventh terminal of the sum/difference bridge; and
- the third differential signal is produced between a fourth terminal and an eighth terminal of the sum/difference bridge, the fourth differential signal is produced between a second terminal and a sixth terminal of the sum/difference bridge.

5. An apparatus for generating an accurate quadrature signal pair as defined in claim 1, further comprising a means for equalizing a magnitude of the first and second differential pairs of signals.

6. An apparatus for generating an accurate quadrature signal pair as defined in claim 3, further comprising:

- a reference oscillator means for providing a reference pair of signals at a desired frequency;
- wherein the reference pair of signals has a first signal and a second signal;
- the second signal is offset 180 degrees from the first signal; and
- the first signal is coupled to the 0 degree and 90 degree input terminals of the polyphase bridge circuit, the second signal is coupled to the 180 degree and 270 degree input terminals of the polyphase bridge circuit.

7. An integrated circuit for generating an accurate quadrature signal pair over a frequency range, comprising:

- a reference oscillator means for providing a reference pair of signals at a desired frequency;
- means for generating a first differential pair and a second differential pair of signals from the reference pair of signals, the first and second differential pair of signals having substantially equal magnitudes; and
- means for producing the sum and difference of the first and second differential pairs of signals to provide a third pair of differential signals and a fourth pair of differential signals, and wherein the third and fourth pair of differential signals have a phase offset of substantially 90 degrees.

8. An apparatus for generating an accurate quadrature signal pair as defined in claim 7, wherein the third and fourth differential pair of signals have a third and fourth magnitude, respectively, the apparatus further comprising a means for equalizing the third and fourth magnitudes.

9. An apparatus for generating an accurate quadrature signal pair as defined in claim 7, wherein the means for generating the first and second pair of differential signals includes a polyphase bridge circuit comprising:

- 0, 90, 180, and 270 degree input terminals;
- 0, 90, 180, and 270 degree output terminals;
- resistive components coupled between the 0 degree input and output terminals, 90 degree input and output terminals, 180 degree input and 180 degree output terminals, and 270 degree input and 270 degree output terminals; and
- capacitive components coupled between the 0 degree input and 270 degree output terminals, 90 degree input and 0 degree output terminals, 180 degree input and 90 degree output terminals, and 270 degree input and 180 degree output terminals;
- wherein the first differential pair of signals is produced between the 0 degree and 180 degree output terminals, and the second differential pair of signals is produced between the 90 degree output and 270 degree output terminals.

10. An apparatus for generating an accurate quadrature signal pair as defined in claim 7, wherein the means for producing the sum and difference of the first and second differential pairs of signals comprises:

- a sum/difference bridge circuit formed of eight resistive components coupled in series in a loop thereby producing eight terminal points;
- the first differential pair of signals is applied between a first terminal and a fifth terminal of the sum/difference bridge, the second differential pair of signals is applied between a third terminal and a seventh terminal of the sum/difference bridge; and
- the third differential signal is produced between a fourth terminal and an eighth terminal of the sum/difference bridge, the fourth differential signal is produced between a second terminal and a sixth terminal of the sum/difference bridge.

11. An apparatus for generating an accurate quadrature signal pair as defined in claim 7, further comprising a means for equalizing a magnitude of the first and second differential pairs of signals.

12. An apparatus for generating an accurate quadrature signal pair as defined in claim 9, wherein the reference pair of signals has a first signal and a second signal;

the second signal is offset 180 degrees from the first signal; and the first signal is coupled to the 0 degree and 90 degree input terminals of the polyphase bridge circuit, the second signal is coupled to the 180 degree and 270 degree input terminals of the polyphase bridge circuit.

13. A method of generating an accurate quadrature signal from a reference signal at a desired frequency, comprising the steps of:

generating a reference pair of signals at a desired frequency, the reference pair including a first signal and a second signal at a 180 offset from the first signal;

applying the reference pair of signals to a polyphase bridge circuit;

producing a first differential pair of signals and a second differential pair of signals from the polyphase bridge circuit, and wherein the first and second differential pairs of signals have substantially equal magnitudes and are offset in phase;

applying the first and second differential pairs of signals to a sum/difference bridge; and producing a third differential pair of signals and a fourth differential pair of signals from the sum/difference bridge, wherein the third differential pair is produced by the sum of the first and second differential pairs of signals and the fourth differential pair of signals is produced by the difference of the first and second differential pairs of signals.

14. A method of generating an accurate quadrature signal from a reference signal as defined in claim 13, further comprising the step of equalizing a magnitude of the third and fourth differential pairs of signals.

* * * * *